United States Patent
Wolf et al.

(10) Patent No.: US 6,996,765 B2
(45) Date of Patent: Feb. 7, 2006

(54) TURBO DECODER PROLOG REDUCTION

(75) Inventors: Tod D. Wolf, Richardson, TX (US); Antonio F. Mondragon-Torres, Richardson, TX (US); Alan Gatherer, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 508 days.

(21) Appl. No.: 10/259,099

(22) Filed: Sep. 27, 2002

(65) Prior Publication Data

US 2003/0097630 A1    May 22, 2003

Related U.S. Application Data

(60) Provisional application No. 60/332,270, filed on Nov. 14, 2001.

(51) Int. Cl.
*H03M 13/00*     (2006.01)
*H03M 13/03*     (2006.01)
*H04L 27/06*     (2006.01)

(52) U.S. Cl. .............. 714/755; 714/780; 714/786; 375/341

(58) Field of Classification Search ............... 714/755, 714/788, 786; 375/341
See application file for complete search history.

(56) References Cited

U.S. PATENT DOCUMENTS 6,725,409 B1 *   4/2004   Wolf ........................ 714/755
6,829,313 B1 *  12/2004   Xu ........................... 375/341

* cited by examiner

*Primary Examiner*—Guy Lamarre
*Assistant Examiner*—Esaw Abraham
(74) *Attorney, Agent, or Firm*—Robert D. Marshall, Jr.; W. James Brady, III; Frederick J. Telecky, Jr.

(57) ABSTRACT

This invention describes implementation approaches for sliding window turbo decoders. Sliding windows are used for both the beta and alpha state metric calculations. Initialization of the beta/alpha prolog sections with data from a previous iteration is employed in conjunction with a reduced length prolog section. For subsequent sliding windows the trellis values of the prolog sections are dynamically initialized based upon data derived from the signal to noise ratio of the calculated extrinsic data or the difference between the two most probable trellis states.

8 Claims, 6 Drawing Sheets

TURBO DECODER PROLOG REDUCTION

This application claims priority under 35 USC §119(e)(1) of Provisional Application No. 60/332,270, filed Nov. 14, 2001.

TECHNICAL FIELD OF THE INVENTION

The technical field of this invention is forward error correction and more particularly turbo decoders.

BACKGROUND OF THE INVENTION

Turbo codes provide forward error correction for many types of communication systems such as wireless applications, satellites, and hard disk drives. Turbo decoding achieves an error performance close to the Shannon limit. The performance is achieved through decoding on multiple iterations. Each iteration results in additional performance and additional computational delay. Making the turbo decoder as small and as simple as possible is very important for VLSI implementations.

Turbo encoding is accomplished by means of concatenation of convolutional codes. FIG. 1A illustrates an example of a prior art rate 1/3 parallel-concatenated turbo encoder. The notation rate 1/3 refers to the configuration of FIG. 1A in which a single input bit stream $x_k$ is converted by the encoder into a 3-component bit stream. Input data stream 100 passes unmodified to multiplexer input 106. Two recursive systematic convolutional (RSC) encoders 102 and 103 function in parallel to transform their input bit streams. The resulting bit streams after transformation by RSC encoder 102 forms multiplexer input 107 and after transformation by RSC encoder 103 forms multiplexer input 108. Block 101 is an interleaver (I) which randomly re-arranges the information bits to decorrelate the noise for the decoder. RSC encoder 102 generates a $p1_k$ bit stream and RSC encoder 103 generates a $p2_k$ bit stream. Under control of a turbo controller function multiplexer 104 reassembles the separate bit streams $x_k$ 106, $p1_k$ 107 and $p2_k$ 108 into the resulting output bit stream $x_k/p1_k/p2_k$ 111.

FIG. 1B illustrates an example of the RSC encoder function which is a part of the blocks 102 or 103. Input data stream 120 passes unmodified to become output $x_0$ 131. After transformation by the RSC encoder the resulting bit streams 131, 132 and 133 in prescribed combinations form multiplexer inputs 107 and 108 of FIG. 1A. The precise combinations are determined by the class of turbo encoder being implemented, 1/2, 1/3, or 1/4 for example. The action of the circuit of FIG. 1B is depicted by a corresponding trellis diagram which is illustrated in FIG. 4 and will be described in the text below.

This transmitted output bit stream 111 of FIG. 1A can be corrupted by transmission through a noisy environment. The function of the decoder at the receiving end is to reconstruct the original bit stream by tracing through multiple passes or iterations through the turbo trellis function.

FIG. 2 illustrates the functional block diagram of a prior art turbo decoder. A single pass through the loop of FIG. 2 is one iteration through the turbo decoder. This iterative decoder generates soft decisions from two maximum-a-posteriori (MAP) blocks 202 and 203. In each iteration MAP block 202 generates extrinsic information $W_{0,k}$ 206 and MAP block 203 generates extrinsic information $W_{1,k}$ 207. First MAP block 202 receives the non-interleaved data $x_k$ 200 and data $p1_k$ 201 as inputs. Second MAP decoder 203 receives data $p2_k$ 211 and interleaved $x_k$ data 210 from the interleaver block 208.

FIG. 3 illustrates the functional block diagram of a prior art MAP block. The MAP block of FIG. 3 includes circuit functions similar to those illustrated in FIG. 2. The MAP block calculates three vectors: beta state metrics, alpha state metrics and extrinsics. Both alpha block 302 and beta block 303 calculate state metrics. It is useful to define the function gamma as:

$$\Gamma_k = f(X_k, P_k, W_k) \quad [1]$$

where: $X_k$ is the systematic data; $P_k$ is the parity data; and $W_k$ is the extrinsics data.

Input 300 to the alpha state metrics block 302 and input 301 to beta state metrics block 302 are referred to as a-priori inputs. The beta state metrics are generated by beta state metrics block 303. These beta metrics are generated in reverse order and stored in the beta state random access memory (RAM) 304. Next, alpha state metrics are generated by alpha state metrics block 302. The alpha state metrics are not stored because the extrinsic block 305 uses this data as soon as it is generated. The beta state metrics are read from beta RAM 304 in a forward order at the same time as the alpha state metrics are generated. Extrinsic block 305 uses both the alpha and beta state metrics in a forward order to generate the extrinsics $W_{n,j}$ 306.

The variables for the MAP algorithm are usually represented by the natural logarithm of probabilities. This allows for simplification of very large scale integration (VLSI) implementation. The recursive equations for the alpha and beta state metrics are as follows:

$$A_{k,s} = \ln\left[\sum_s \exp\{A_{k-1} + \Gamma_k\}\right] \quad [2]$$

$$B_{k,s} = \ln\left[\sum_s \exp\{B_{k-1} + \Gamma_k\}\right] \quad [3]$$

where: s is the set of states in the trellis; and $\Gamma_k$ is as stated in equation [1] above.

To more clearly understand the operation of the decoder it is helpful to review the operations of the encoder. The data input to the encoder is in the form of blocks of 'n' information bits (n=5114=frame size) and the encoding proceeds from the zero state of the trellis. After n cycles through the trellis the encoder ended at some unknown state.

In an encoder without sliding windows, the frame size of the block contains n×s×d bits. For a frame size n of 5114, a number of trellis states s of 8 and a number of bits of data precision d equal to 8 bits, then n×s×d=327,296 bits and N cycles through the trellis. With sliding windows, the processing of each window involves r+p cycles and r×s×d bits, where: r is the size of the reliability portion of the sliding window; and p is the prolog size. This requires r iterations through the trellis. Consider the example where r=128. Then for the sliding windows case, processing involves r×s×d=8192 bits and r+p=j cycles where: j=n/r. Clearly, the decoder memory size requirements are greatly reduced through the use of sliding windows at a cost of more cycles.

During encoding a number of tail bits t are appended to the encoder data stream to force the encoder back to the zero state. For a constraint length k code, where t=k−1, there are systematic tail bits for each RSC encoder. Consider the example of an eight state code where k=4 and t=3. The alpha state metric block will process the received data from 0 to n+2 and the beta state metric block will process the data from to n+2 to 0.

In FIG. 3, both the alpha state 302 and beta state 303 metric blocks calculate state metrics. Both start at a known location in the trellis, the zero state. The encoder starts the block of n information bits, where n is the frame size of 5114, at the zero state. After n cycles through the trellis, the encoder ends at some unknown state.

The beta state metrics are generated first by block 303. These beta metrics are generated in reverse order and stored in beta state metric RAM 304. Next, the alpha state metrics are generated by block 302. The alpha state metrics are not stored because the extrinsic block uses this data as soon as it is generated. The beta state metrics are read from the memory in a forward order at the same time as the alpha state metrics are generated. The extrinsic block 305 uses both the alpha and beta state metrics in a forward order to generate the extrinsics $W_{n,j}$ 306.

FIG. 4 illustrate a trellis diagram for an 8-state state encoder depicting the possible state transitions from each possible state $S_{k,x}$=ABC. For example, for state $S_{k,4}$, ABC=001. These states are represented in FIG. 1B by the state of the three registers A 121, B 122 and C 123, respectively. In the decoder, the generation of the alpha state metrics requires processing the data in a forward direction through this trellis and the generation of the beta state metrics requires processing the data in a reverse direction through this trellis. Initial states in the trellis for forward traversal are labeled $S_{k,x}$ and next states are labeled $S_{k+1,x}$. Conversely, initial states in the trellis for reverse direction traversal are labeled $S_{k+1,x}$ and next states are labeled $S_{k,x}$. The nomenclature X/DEF of 403 and 404 of FIG. 4 refers to the next bit 'Y' inserted at the input $X_k$, 120 of FIG. 1B, followed by the forward slash, followed by the next three bits D, E and F generated respectively at the nodes 131, 132, 133 of FIG. 1B.

Turbo decoder processing is an iterative process requiring multiple cycles until a low bit-error ratio (BER) solution is obtained. Because the state of the trellis at the start of processing is unknown the probability of the occurrence of all the states in the trellis is initialized to a uniform constant. For each pass through the trellis, the probability of occurrence of a given state will increase or decrease as convergence to the original transmitted data proceeds. After processing through the trellis a number of times a set of states corresponding to the original transmitted data becomes dominant and the state metrics become reliable.

FIG. 5 illustrates a diagram in which the block of size n is broken into several smaller pieces. Each piece is called a sliding window (sw) and is composed of two parts. These two parts are the reliability (r) section 501 and the prolog (p) section 502. Normally the encoded block starts the trellis in the 0 state and ends in the 0 state. S is the number of states where $S=2^v$ and v is the number of encoder memory registers. The tail bits, are labeled t 503 in FIG. 5 where v=t tail bits are appended to the encoded block to force this condition.

Decoder processing is an iterative process requiring multiple cycles until a low bit-ratio solution is obtained. The sliding windows in general start at some random unknown state. The exception is the sliding window that ends with the tail bits. Due to the fact that the initial state is unknown it is necessary to add additional computations through the trellis to achieve good starting results. Because the state of the trellis at the start of the prolog is unknown except that the last beta sliding window is terminated with the tail bits, the probability of the occurrence of all the states in the trellis is initialized to a uniform constant. For each pass through the trellis, the probability of occurrence of a given state will increase or decrease during convergence to the original transmitted data. After processing through the trellis a number of times equal to p, the prolog size, a set of states corresponding to the original transmitted data becomes dominant and the state metrics become reliable. Recommended sizes for p are 4 to 6 times the constraint length of the trellis.

For example, if n=4096, r=128, S=16 and the code rate is 1/3, then there are 32 sliding windows and p=30. For punctured codes such as code rate 1/2, the prolog must grow for equivalent performance. In this example, the prolog would grow from 30 to 48. This solution reduces the memory from 64 k bytes to 2 k bytes at a cost of increasing the number of trellis stages from 4096 to (128+48)×31+ (128+4)=5588.

Prolog reduction techniques are directed to reducing the number of passes required through the trellis function to achieve an acceptable bit error ratio (BER). For voice data an acceptable BER might be 1000:1, but for data transmission an acceptable BER is more likely in the range of 1,000,000:1. The crux of the problem is how does the optimum system initialize the states as it proceeds through the successive states in the trellis.

Some proposed initialization guidelines are:

1. Setting all zeros as the starting state. This requires no memory and operates with prolog p=48.

2. Saving all states $\alpha_S$ and $\beta_S$ setting the prolog between the limits p=0 through p=48. This requires a very large memory.

FIG. 6 illustrates initialization of all states of the proceeding beta sliding window. For the first iteration of swA 601, the states are initialized with a uniform distribution. Sliding window swA 601 is processed. For the first iteration of swB 602, the states are initialized with a uniform distribution and swB 602 is processed. The final value of the states of swB 602 are stored into memory. This procedure is repeated for the remaining sliding windows. During the second iteration, swA 601 is initialized with the stored values of swB 602, and swA 601 is processed. During the second iteration, swB 602 is initialized with the stored values of swC 603 and swB 602 is processed. This sequence of initialization continues for each iteration.

Static state initialization works and gives good results but it does have difficulties. Because the first iteration is initialized with a uniform distribution and there is no prolog, the first iteration results are sub-optimum. It will take more iterations using this technique to achieve the same bit error rate as with a prolog section. Another difficulty is convergence. If the channel noise is too high, then the sliding window initializations might be incorrectly set leading to non-convergence.

Saving all states requires a large amount of memory. For example if S=256, n=4096, w=128, and a fixed-point size of 8 bits, then (4096÷128)×256×8×2MAPs×2=262K bits must be saved.

Saving the states with optimum probability, both alpha and beta, h=arg(max$\Sigma B_{k,s}$), and storing value h lowers the memory size required. For S=256, it takes 8 bits to store h. Using this static value for initialization is attractive for VLSI implementation due to the smaller memory requirements.

For the above example only (4096÷128) ×8×2MAPs×2=1024 bits are required. The initialization of the state metrics is done by setting the starting state metric to the highest value and the other states to a lower value. For example, if h=3, then s[3]=16, s[0]=s[1]=s[2]=s[4]=s[5]= . . . =s[255]=0.

These first two approaches use either a full prolog section or no prolog section. Using a full prolog section requires the most computational overhead per MAP decode, but it gives the best bit error rate (BER). Using no prolog section requires the fewest number of operations per MAP; but it gives the worst bit error rate.

SUMMARY OF THE INVENTION

Turbo decoders normally have implementations that make use of sliding windows in the calculation of state metrics and typically apply the sliding windows only to the beta metrics block. These sliding windows often have both a reliability component and a prolog component. Use of the prolog component, while requiring additional decoder hardware, acts to effectively initialize the successive iterative processes directing them to stronger convergence. Reduction of prolog size to an optimized value has a strong influence on the improving decoder performance with respect to bit error ratio and lowest possible iterations required.

This invention optimizes the results of metrics calculations by: (a) adding a small amount of prolog hardware that is initialized with data from the previous iteration; and (b) dynamically scaling prolog initialization through the monitoring of extrinsic signal to noise ratio (SNR). This invention improves bit error ratio (BER) using initialization in the added prolog section, provides for parallel implementation of sliding windows decoding and the formation of improved stopping criteria results.

BRIEF DESCRIPTION OF THE DRAWINGS

These and other aspects of this invention are illustrated in the drawings, in which.

DETAILED DESCRIPTION OF PREFERRED EMBODIMENTS

This invention describes techniques that may be used to improve the performance and efficiency of turbo decoder designs. These techniques act to optimize the results of metrics calculations by: (a) adding a small amount of prolog hardware that is initialized with data from the previous iteration; and (b) dynamically scaling prolog initialization through the monitoring of extrinsic SNR. An important aspect of the invention is the careful evaluation and optimization of three additional possible approaches to decoder initialization. These are:

1. Saving best state with optimum probability and use static values for initialization;

2. Saving best state with optimum probability but use dynamic values for initialization; and 3. Saving best state with optimum probability but use difference between top two states as value for initialization.

The present invention proposes a new method that combines the prolog initialization with a small prolog section. The required length of the uniform initialized prolog section of the sliding window normally is 4 to 6 times the constraint length of the encoder. The proposed smaller prolog length will be in the range from ½ to 2 times the constraint length. The smaller prolog section can be initialized and processed with good performance. The technique of prolog initialization with a smaller prolog section can be applied to both the beta metrics and alpha metrics blocks.

Figure 1A:
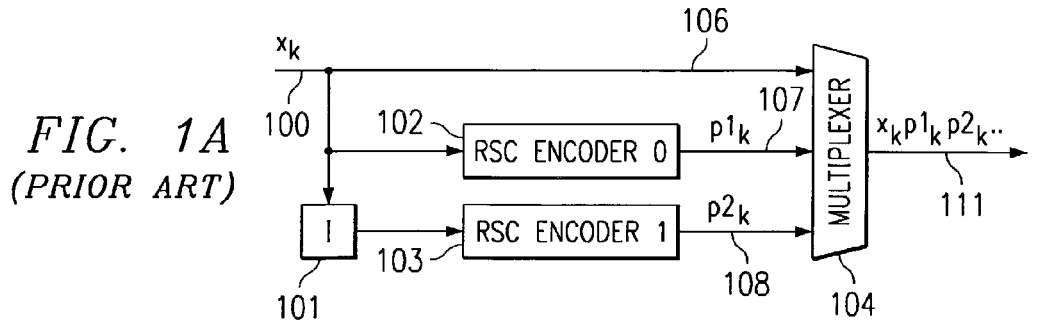
FIG. 1A illustrates the block diagram of a prior art turbo encoder function.
Figure 1B:
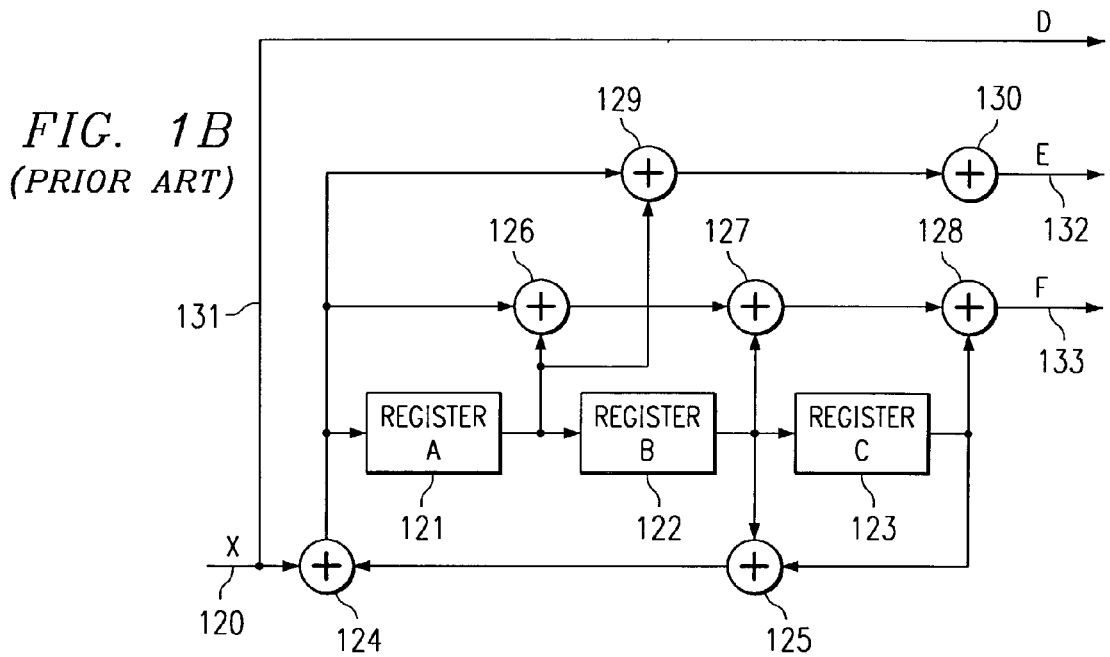
FIG. 1B illustrates the circuit diagram of an RSC encoder function used in the implementation of a turbo encoder of the prior art.
Figure 2:
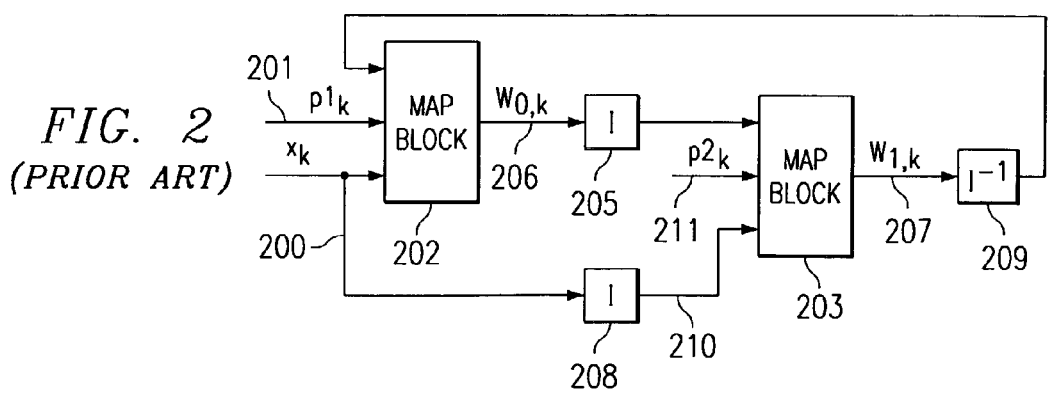
FIG. 2 illustrates a lower level functional block diagram of a conventional turbo decoder of the prior art.
Figure 3:
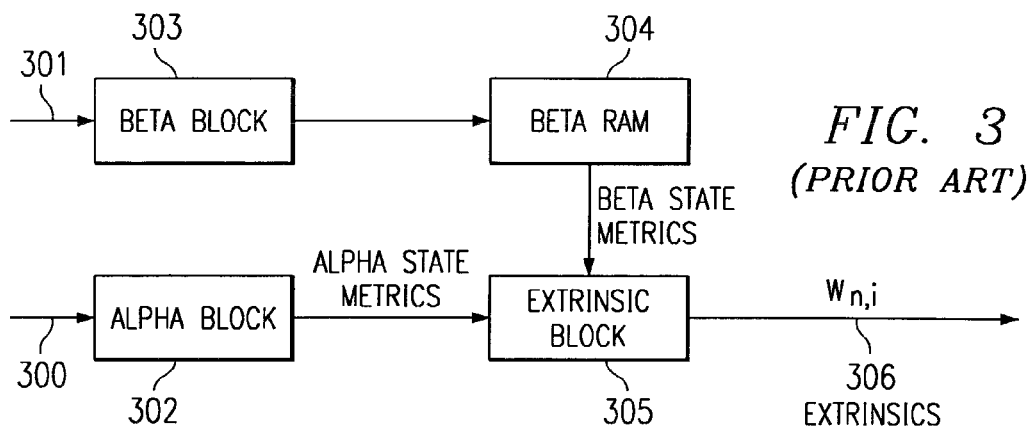
FIG. 3 illustrates a functional block diagram of a MAP decoder of the prior art.
Figure 4:
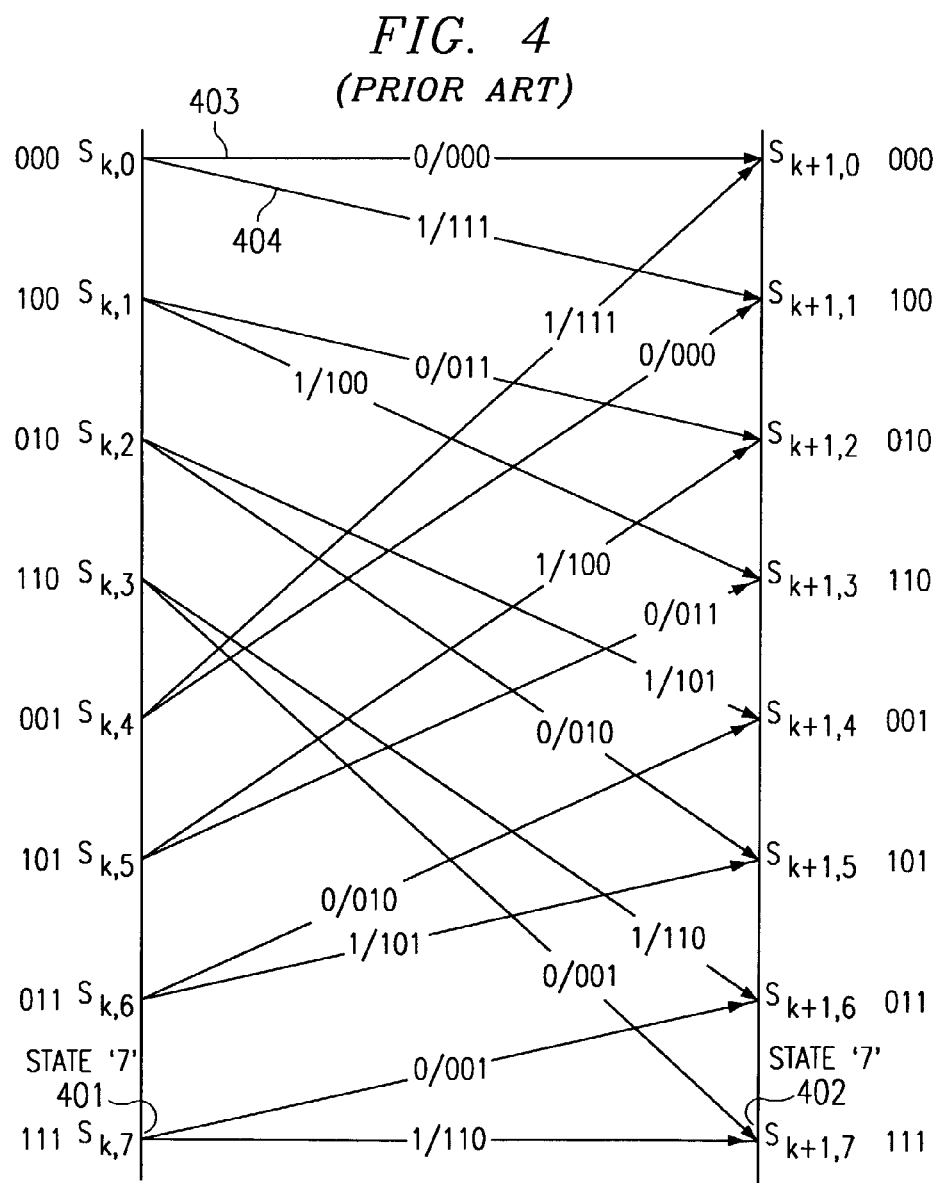
FIG. 4 illustrates breaking a block of size 'n' into sliding window blocks of size 'r' of the prior art.
Figure 5:
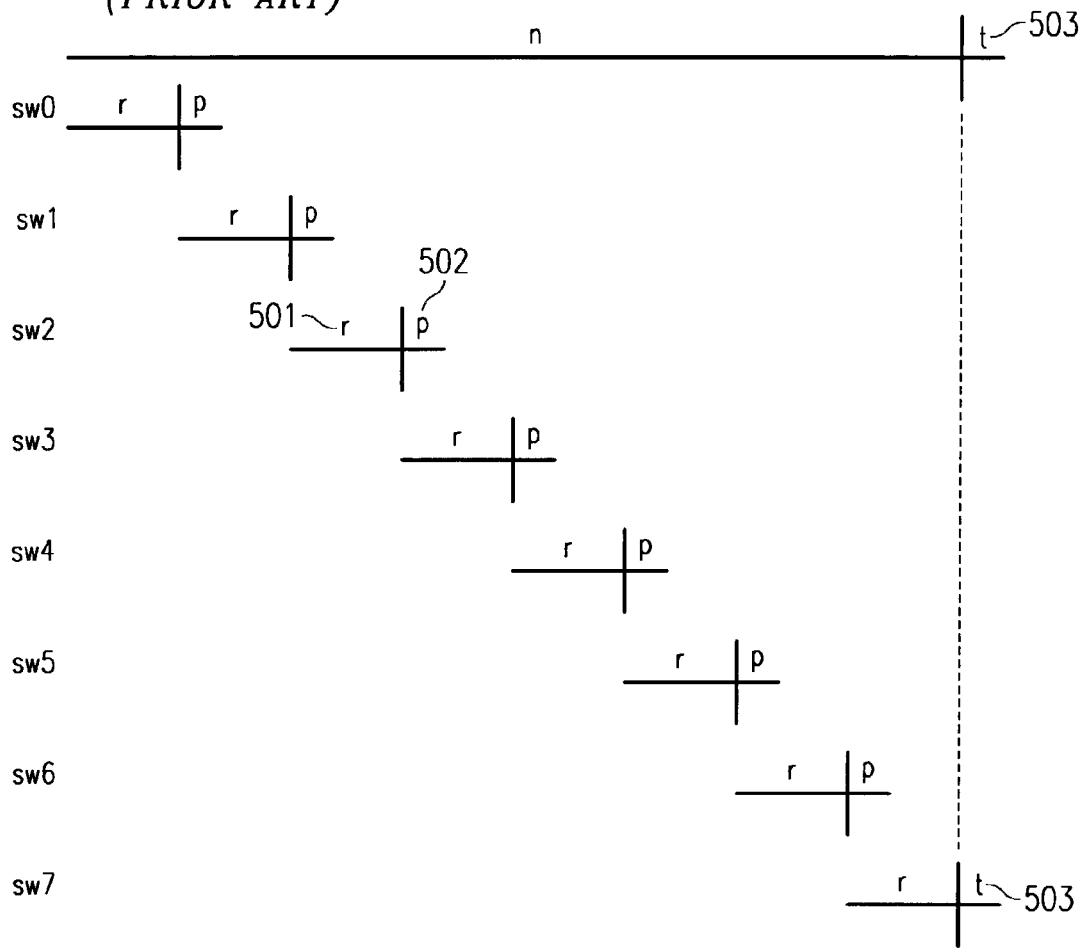
FIG. 5 illustrates breaking a frame into sliding windows for beta metrics calculation of the prior art.
Figure 6:
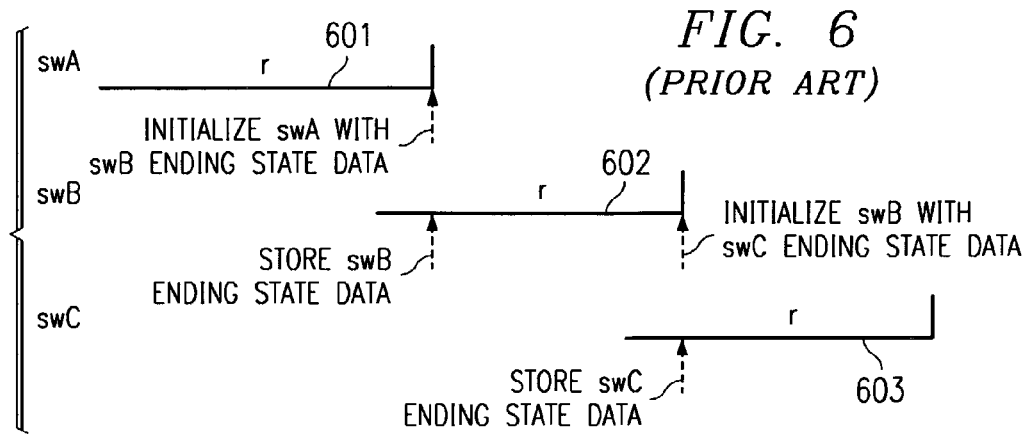
FIG. 6 illustrates a sliding windows initialization technique of the prior art.
Figure 7:
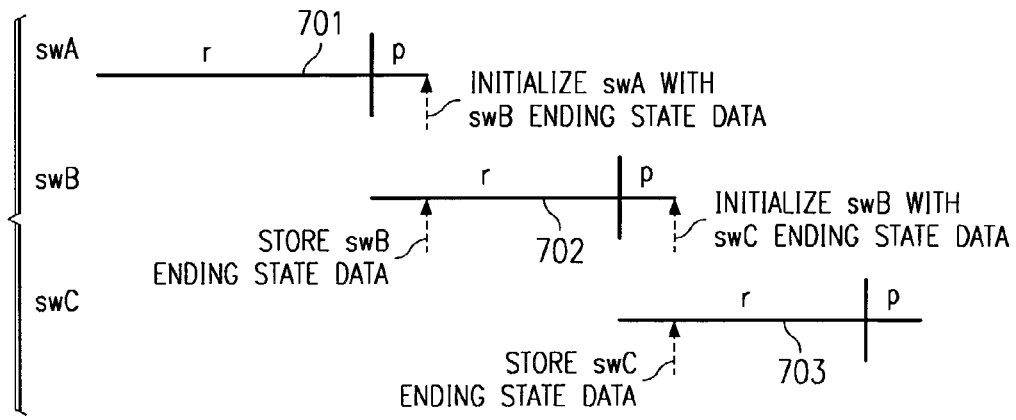
FIG. 7 illustrates a prolog reduction technique.

FIG. 7 illustrates his technique for the beta metrics block. For the first iteration of swA 701, the states are initialized with a uniform distribution. Sliding window swA 701 is processed. For the first iteration of swB 702, the states are initialized with a uniform distribution and swB 702 is processed. The final value of the states of swB 702 are stored into memory. This procedure is repeated for the remaining sliding windows. During the second iteration, the prolog p of swA 701 is initialized with the stored values of swB 702, and swA 701 is processed. During the second iteration, the prolog of swB 702 is initialized with the stored values of swC 703 and swB 702 is processed. This sequence of initialization continues for each iteration.

Figure 8:
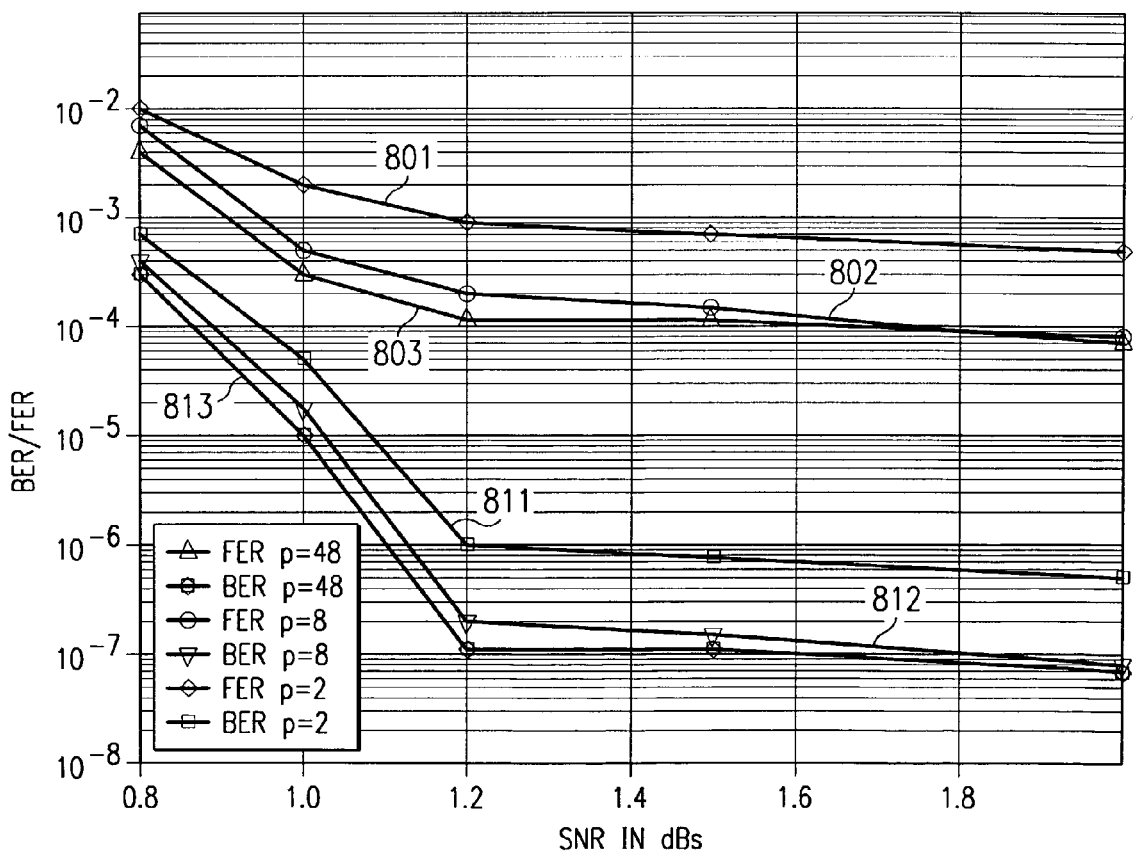
FIG. 8 illustrates turbo prolog reduction bit error ratios techniques.

FIG. 8 illustrates the simulation results using different sizes of prolog according to this invention. Both the beta and alpha prolog initializations were included in these simulations. Three different sizes of prologs were tested: 48, 8, and 2. The plots show both the bit error rate (BER) and the frame error rate (FER) for 8 iterations, n=1024, w=128 and S=16. The best results are for a prolog size of 48 and the worst results are for a prolog size of 2. Clearly, a prolog size of 0 would even be worse. These plots show good performance using the prolog static initialization technique with a prolog length of ½ to 2 times the constraint length.

The previous section briefly mentioned how to initialize the states. The desired state was given a high probability-related value and the other states were given uniform smaller values. The difference between the high value and the lower values is important. The magnitude of the difference represents the probability that the sliding window is in the correct state. The larger the difference, the higher the probability the system assigns that the sliding window is in the correct state. Small differences represent smaller probabilities that the sliding windows are in the correct state. If the difference is zero, then the system has no information regarding the correctness of the state.

To determine the difference in state value magnitudes for the prolog initialization the system proceeds to initialize the prolog in one of two obvious ways with the correct state or the incorrect state. If the initialization difference is large and the correct state initialization is made, then the sliding window will decode well. If the initialization difference is large and the incorrect state initialization is made, an unfortunate result will follow. It will take many trellis stages of calculations for the decoder to recover and determine the correct state. If the channel noise is high, then the decoder could easily fail and not converge to a solution.

If the initialization difference is small and the correct state initialization is made, then the decoding process will proceed properly. But, the stopping criteria by which a completed process is evaluated will not work optimally because the extrinsic variance will be larger than expected. If the initialization difference is small and the incorrect state initialization is made, then the decoder takes several trellis stages of calculations before it can determine the correct state. A smaller starting difference will result in a more rapid convergence than a larger starting difference for incorrect initializations.

There are well known proposed stopping criteria for measuring the signal to noise ratio (SNR) of the extrinsics generated from each MAP decode. The calculated SNR is a measure of the probability of the extrinsics. This measure can be used to dynamically scale the prolog initialization. If the calculated SNR is low, then set the difference of the prolog initialization to a small value. This will allow the decoder the ability to correct the incorrect initialization in a few trellis stages. As the SNR increases, the prolog initialization differences can also increase. Larger SNR values represent better probabilities that the decoder is in the correct state. One possible dynamic scaling is shown in Table 1.

TABLE 1

| Extrinsic Signal to Noise Ratio | Value Assigned to Best State | Value Assigned to Other States |
| --- | --- | --- |
| x < 1 | 2.0 | 0.0 |
| 1.0 ≦ x < 5.0 | 4.0 | 0.0 |
| 5.0 ≦ x < 10.0 | 8.0 | 0.0 |
| 10.0 ≦ x | 16.0 | 0.0 |

The trellis state having the highest value is detected. This trellis state is the best state. For the next iteration the prolog section is initialized with the best trellis state having the value shown in Table 1. This value is higher when the extrinsics signal to noise ratio is higher. Other trellis states are initialized to a uniform value of zero.

Figure 9:
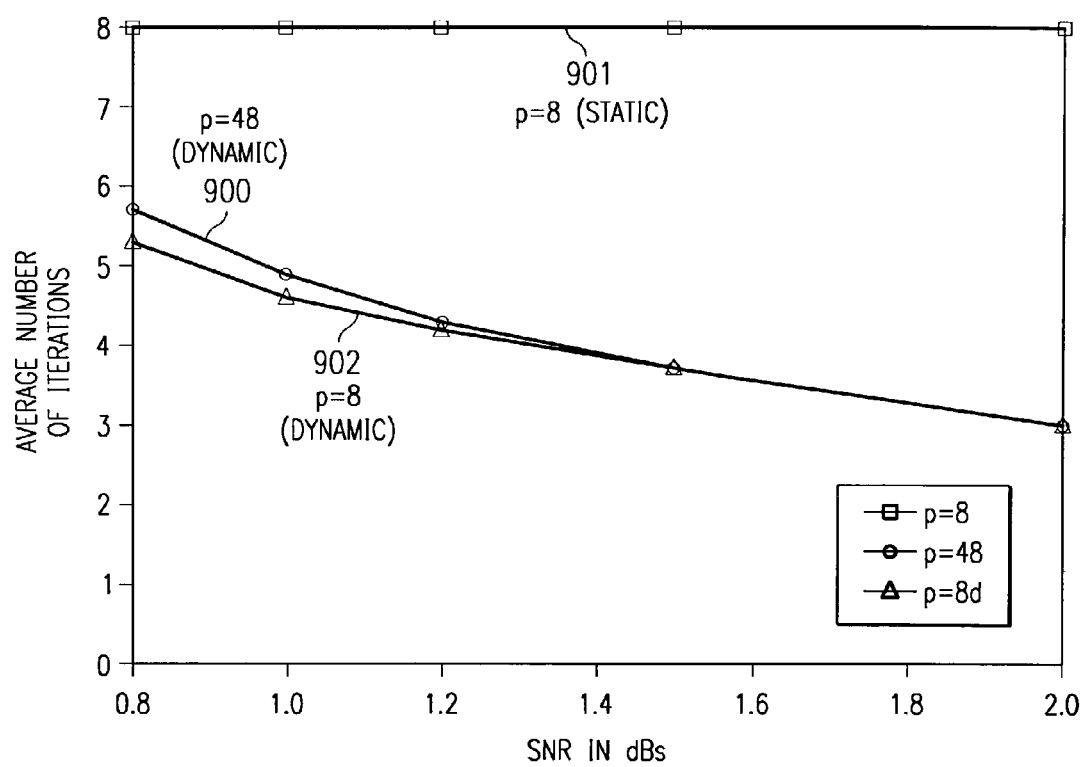
FIG. 9 illustrates average number of iterations versus prolog reduction.

FIG. 9 illustrate the results of this selection. FIG. 9 illustrates the average number of iterations for the turbo decode process to converge to the correct data versus signal to noise ratio (SNR) in dBs for three examples for prolog length and dynamic versus static prolog initialization. Curve 900, where the prolog length is 48 with dynamic prolog initialization, gives the best BER results with a small number of average number of iterations. For curve 901, where the prolog length is 8 with static prolog initialization, the average number of iterations is always 8. This is due to the large variance in the extrinsics even when the extrinsics have converged to the correct result. Curve 902 illustrates the case where the prolog length is 8 and including dynamic prolog initialization. Curve 902 gives virtually identical BER performance as compared with the curve 900, but its average number of iterations is similar to curve 900.

Another method of dynamic scaling is to save both the index of the best state and the difference between the two states with the highest values. Both of these values are stored for every beta and/or alpha sliding window for each MAP decode. Each pair of data will be used to initialize the adjacent beta and/or alpha sliding window for the next iteration. The adjacent sliding window initialization technique is the same as described above. All the states except for the most likely state (referred to as state h) will be initialized to a constant value. State h will be initialized with the difference value saved from the previous iteration. As the decoding gets better, the difference between the two highest magnitudes will continue to grow. This dynamic scaling will provide stronger estimates of the correct starting states for each independent sliding window.

Figure 10:
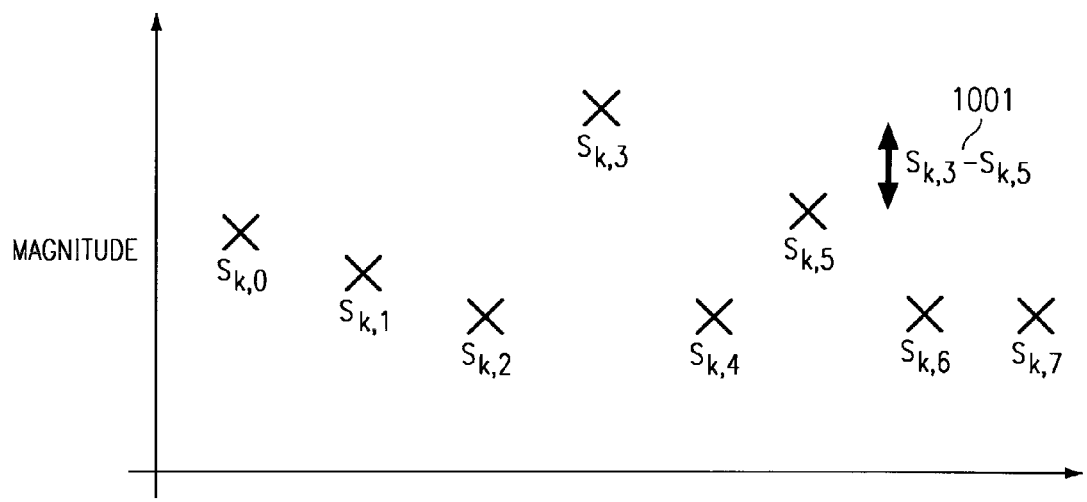
FIG. 10 illustrates ending magnitudes of one window.
Figure 11:
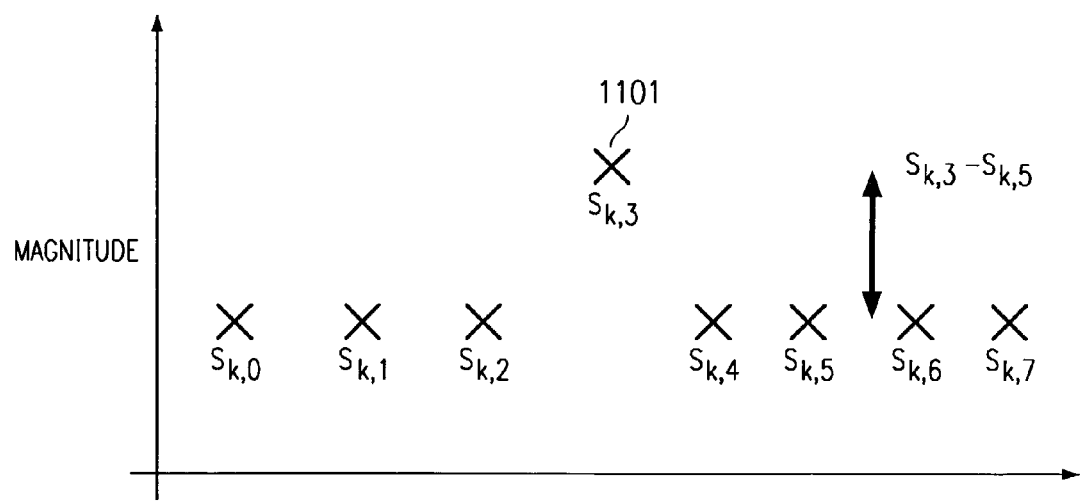
FIG. 11 illustrates starting magnitudes of adjacent window for next iteration.

FIG. 10 and FIG. 11 illustrate an example of this type of dynamic scaling for a decoder. FIG. 10 shows the ending state value magnitudes of one of the sliding windows. $S_{k,3}$ has the highest magnitude and $S_{k,5}$ has the second highest. Difference $S_{k,3}-S_{k,5}$ 1001, which is 3, is saved. FIG. 11 shows the starting state value magnitudes of the adjacent sliding window for the next iteration after initialization. Notice that the best state $S_{k,3}$ 1101 is initialized with the largest value.

This method has the potential to give better results than the first method of dynamic scaling. Each window is dynamically scaled independently of each other as compared with the first method in which one difference is used for all sliding windows. This will allow windows with fewer errors a chance to output bigger differences than windows with more errors. Because of the iterative nature of turbo decoders, this method could achieve better BER results.

Turbo decoder implementations clearly are simplified using the sliding window technique. Three implementation ideas have been described here with regard to the efficient use of the number of iterations required in the processing. Secondly, shortening the prolog section and initializing it with data from a different sliding window is effective. Thirdly, dynamic scaling of the prolog initialization according to the SNR of the extrinsics or the differences between the magnitudes of the two best states improves results.

What is claimed is:

1. A method of forward error correction employing turbo decoding comprising the steps of:

receiving a transmitted bit stream;

iteratively calculating alpha state metrics employing maximum-a-posteriori (MAP) blocks having a predetermined constraint length in a plurality of sliding windows, each sliding window having a prolog section and a reliability section, said prolog section having a length between one half said predetermined constraint length and twice said predetermined constrain length;

iteratively calculating beta state metrics employing maximum-a-posteriori (MAP) blocks having said predetermined constraint length in a plurality of sliding windows, each sliding window having a prolog section and a reliability section, said prolog section having a length between one half said predetermined constraint length and twice said predetermined constrain length;

measuring a signal to noise ratio for said extrinsics calculated from each alpha metric sliding window and a corresponding beta metric sliding window;

each of said steps of iteratively calculating alpha state metrics and iteratively calculating beta state metrics includes initializing trellis state probabilities to a uniform level for said prolog section of a first sliding window, and initializing trellis state probabilities for said prolog section of sliding windows after said first sliding window dependent upon said trellis states at the end of a prior sliding window and said measured signal to noise ratio for said extrinsics of said prior sliding window;

calculating extrinsics from said alpha state metrics and said beta state metrics; and reconstructing an original bit stream from said calculated extrinsics.

2. The method of claim 1, wherein:
each of said steps of iteratively calculating alpha state metrics and iteratively calculating beta state metrics wherein initializing trellis state probabilities for said prolog section of sliding windows after said first sliding window initializes a trellis state having the highest value in said prior sliding window to a first value directly proportional to said measured signal to noise ratio for said extrinsics of said prior sliding window and initializes other trellis states to a uniform second value lower than said first value.

3. The method of claim 2, wherein:
each of said steps of iteratively calculating alpha state metrics and iteratively calculating beta state metrics wherein initializing trellis state probabilities for said prolog section of sliding windows after said first sliding window initializes said trellis states as follows:

| Extrinsic Signal to Noise Ratio | Value Assigned to Best State | Value Assigned to Other States |
|---|---|---|
| $x < 1$ | 2.0 | 0.0 |
| $1.0 \leq x < 5.0$ | 4.0 | 0.0 |
| $5.0 \leq x < 10.0$ | 8.0 | 0.0 |
| $10.0 \leq x$ | 16.0 | 0.0 | where said best state is the trellis state of said prior sliding window having the highest value.

4. A method of turbo decoding comprising the steps of:
receiving a transmitted bit stream;
iteratively calculating alpha state metrics employing maximum-a-posteriori (MAP) blocks having a predetermined constraint length in a plurality of sliding windows, each sliding window having a prolog section and a reliability section, said prolog section having a length between one half said predetermined constraint length and twice said predetermined constrain length;
iteratively calculating beta state metrics employing maximum-a-posteriori (MAP) blocks having said predetermined constraint length in a plurality of sliding windows, each sliding window having a prolog section and a reliability section, said prolog section having a length between one half said predetermined constraint length and twice said predetermined constrain length;
each of said steps of iteratively calculating alpha state metrics and iteratively calculating beta state metrics includes
initializing trellis state probabilities to a uniform level for said prolog section of a first sliding window, and
after each sliding window determining a trellis state having a highest value and a difference value between said trellis state having said highest value and a trellis state having a second highest value, and
initializing trellis state probabilities for said prolog section of sliding windows after said first sliding window by initializing trellis states other than said trellis state having the highest value to a uniform first value and initializing said trellis state having the highest value in said prior sliding window to a second value equal to said first value plus said difference value;
calculating extrinsics from said alpha state metrics and said beta state metrics; and
reconstructing an original bit stream from said calculated extrinsics.

5. A rate 1/3 turbo decoder comprising:
a first maximum-a-posteriori block having a first input, a second input receiving a first encoded portion of a rate 1/3 multiplexed transmitted bit stream, a third input receiving an unencoded portion of a rate 1/3 multiplexed transmitted bit stream and an output;
a first interleaver having an input receiving said output of said first maximum-a-posteriori block and an output;
a second interleaver having an input receiving an unedcoded portion of a rate 1/3 multiplexed transmitted bit stream and an output;
a second maximum-a-posteriori block having a first input connected to said output of said first interleaver, a second input receiving a second encoded portion of a rate 1/3 multiplexed transmitted bit stream, a third input connected to said output of said second inteleaver and an output;
a deinterleaver having an input connected to said output of said second maximum-a-posteriori block and an output connected to said first input of said first maximum-a-posteriori block;
each of said first maximum-a-posteriori block and said second maximum-a-posteriori block operable to:
iteratively calculate alpha state metrics having a predetermined constraint length in a plurality of sliding windows, each sliding window having a prolog section and a reliability section, said prolog section having a length between one halt said predetermined constraint length and twice said predetermined constrain length,
iteratively calculate beta state metrics having said predetermined constraint length in a plurality of sliding windows, each sliding window having a prolog section and a reliability section, said prolog section having a length between one half said predetermined constraint length and twice said predetermined constrain length,
measure a signal to noise ratio for said extrinsics calculated from each alpha metric sliding window and a corresponding beta metric sliding window,
iteratively calculate alpha state metrics and iteratively calculate beta state metrics by
initializing trellis state probabilities to a uniform level for said prolog section of a first sliding window, and
initializing trellis state probabilities for said prolog section of sliding windows after said first sliding window dependent upon said trellis states at the end of a prior sliding window and said measured signal to noise ratio for said extrinsics of said prior sliding window, and
calculate extrinsics from said alpha state metrics and said beta state metrics.

6. The rate 1/3 turbo decoder of claim 5, wherein:
each of said first maximum-a-posteriori block and said second maximum-a-posteriori block is further operable to:
iteratively calculate alpha state metrics and iteratively calculate beta state metrics by initializing trellis state probabilities for said prolog section of sliding windows after said first sliding window initializes a trellis state having the highest value in said prior sliding window to a first value directly proportional to said measured signal to noise ratio for said extrinsics of said prior sliding window and initializes other trellis states to a uniform second value lower than said first value.

7. The of rate 1/3 turbo decoder claim 6, wherein:
each of said first maximum-a-posteriori block and said second maximum-a-posteriori block is further operable to:
iteratively calculate alpha state metrics and iteratively calculate beta state metrics by initializing trellis state probabilities for said prolog section of sliding windows after said first sliding window initializes said trellis states as follows:

| Extrinsic Signal to Noise Ratio | Value Assigned to Best State | Value Assigned to Other States |
|---|---|---|
| x < 1 | 2.0 | 0.0 |
| 1.0 ≤ x < 5.0 | 4.0 | 0.0 |
| 5.0 ≤ x < 10.0 | 8.0 | 0.0 |
| 10.0 ≤ x | 16.0 | 0.0 | where said best state is the trellis state of said prior sliding window having the highest value.

8. A rate 1/3 turbo decoder comprising:
a first maximum-a-posteriori block having a first input, a second input receiving a first encoded portion of a rate 1/3 multiplexed transmitted bit stream, a third input receiving an unencoded portion of a rate 1/3 multiplexed transmitted bit stream and an output;
a first interleaver having an input receiving said output of said first maximum-a-posteriori block and an output;
a second interleaver having an input receiving an unedcoded portion of a rate 1/3 multiplexed transmitted bit stream and an output;
a second maximum-a-posteriori block having a first input connected to said output of said first interleaver, a second input receiving a second encoded portion of a rate 1/3 multiplexed transmitted bit stream, a third input connected to said output of said second inteleaver and an output;
a deinterleaver having an input connected to said output of said second maximum-a-posteriori block and an output connected to said first input of said first maximum-a-posteriori block;

each of said first maximum-a-posteriori block and said second maximum-a-posteriori block operable to:
iteratively calculate alpha state metrics having a predetermined constraint length in a plurality of sliding windows, each sliding window having a prolog section and a reliability section, said prolog section having a length between one half said predetermined constraint length and twice said predetermined constrain length,
iteratively calculate beta state metrics having said predetermined constraint length in a plurality of sliding windows, each sliding window having a prolog section and a reliability section, said prolog section having a length between one half said predetermined constraint length and twice said predetermined constrain length,
iteratively calculate alpha state metrics and iteratively calculate beta state metrics by
initializing trellis state probabilities to a uniform level for said prolog section of a first sliding window,
after each sliding window determining a trellis state having a highest value and a difference value between said trellis state having said highest value and a trellis state having a second highest value, and
initializing trellis state probabilities for said prolog section of sliding windows after said first sliding window by initializing trellis states other than said trellis state having the highest value to a uniform first value and initializing said trellis state having the highest value in said prior sliding window to a second value equal to said first value plus said difference value; and
calculate extrinsics from said alpha state metrics and said beta state metrics.

* * * * *